United States Patent
Kwon-Chang et al.

(10) Patent No.: US 7,355,543 B2
(45) Date of Patent: Apr. 8, 2008

(54) DIGITAL-TO-ANALOG CONVERTER USING CAPACITORS AND OPERATIONAL AMPLIFIER

(75) Inventors: Il Kwon-Chang, Gimpo-si (KR); Min-Gwang Kang, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/557,694

(22) Filed: Nov. 8, 2006

(65) Prior Publication Data

US 2007/0194964 A1    Aug. 23, 2007

(30) Foreign Application Priority Data

Nov. 8, 2005    (KR) .................. 10-2005-0106357

(51) Int. Cl.
H03M 1/66    (2006.01)
(52) U.S. Cl. .................. 341/150; 341/144; 341/145
(58) Field of Classification Search ................ 341/150, 341/144, 145
See application file for complete search history.

(56) References Cited

U.S. PATENT DOCUMENTS

| | | | | |
|---|---|---|---|---|
| 5,990,819 A | * | 11/1999 | Fujimori | 341/150 |
| 6,118,399 A | * | 9/2000 | Krone | 341/150 |
| 6,144,331 A | * | 11/2000 | Jiang | 341/172 |
| 6,169,509 B1 | * | 1/2001 | Abe | 341/150 |
| 6,437,720 B1 | * | 8/2002 | Yin et al. | 341/150 |
| 6,667,707 B2 | * | 12/2003 | Mueck et al. | 341/172 |
| 6,693,574 B2 | * | 2/2004 | Yamamura | 341/150 |
| 7,102,558 B2 | * | 9/2006 | Deval | 341/150 |
| 2002/0140595 A1 | * | 10/2002 | Karube | 341/150 |
| 2003/0179122 A1 | * | 9/2003 | Yamamura | 341/150 |
| 2004/0227652 A1 | * | 11/2004 | Draxelmayr | 341/120 |

FOREIGN PATENT DOCUMENTS

| | | |
|---|---|---|
| JP | 2001-125543 | 5/2001 |
| KR | 10-0248133 | 12/1999 |
| KR | 10-0417465 | 1/2004 |

* cited by examiner

Primary Examiner—Linh Nguyen
(74) Attorney, Agent, or Firm—F. Chau & Assoc., LLC

(57) ABSTRACT

A digital-to-analog converter using capacitors and an operational amplifier, which can be highly integrated due to its small area and which can rapidly perform a stable converting operation. The digital-to-analog converter includes a data input unit, a first conversion unit, a second conversion unit, and a signal output unit. When digital data is input to the data input unit, the data input unit is connected to the first conversion unit or the second conversion unit. The first conversion unit charges a first charging capacitor with a voltage corresponding to the input digital data and distributes the charged charges to a first distribution capacitor. The second conversion unit charges a second charging capacitor with the voltage corresponding to the input digital data and distributes the charged charges to a second distribution capacitor. The signal output unit outputs an analog data signal corresponding to the voltage across the first distribution capacitor or the voltage across the second distribution capacitor in response to a select control signal.

31 Claims, 10 Drawing Sheets

DIGITAL-TO-ANALOG CONVERTER USING CAPACITORS AND OPERATIONAL AMPLIFIER

CROSS-REFERENCE TO RELATED PATENT APPLICATION

This application claims the benefit of Korean Patent Application No. 10-2005-0106357, filed on Nov. 8, 2005, in the Korean Intellectual Property Office, the disclosure of which is incorporated herein in its entirety by reference.

BACKGROUND OF THE INVENTION

1. Technical Field

The present disclosure relates to a digital-to-analog converter using capacitors and an operational amplifier and, more particularly, to a digital-to-analog converter that can be highly integrated due to its small area and that can rapidly perform a stable converting operation.

2. Discussion of the Related Art

A digital-to-analog converter that converts digital data into an analog signal includes a resistor string converter and a decoder and a capacitor converter using the charging of a capacitor and charge distribution.

FIG. 1 is a block diagram of a conventional resistor string converter. Referring to FIG. 1, the resistor string converter includes a resistor string 102, a decoder 104 and a buffer 106. When a maximum voltage Vmax and a minimum voltage Vmin are applied to both ends of the resistor string 102, a plurality of voltages Vi1, Vi2, . . . , Vik falling between the maximum voltage Vmax and the minimum voltage Vmin are applied to the decoder 104. The decoder 104 receives a digital data input, selects from among the voltages Vo1, Vo2, . . . , Vok corresponding to the received digital data, and outputs the selected voltages Vo1, Vo2, . . . , Vok through output terminals. The selected voltages Vo1, Vo2, . . . , Vok output through the output terminals are supplied to an external device (not shown) through the buffer 106.

The aforementioned resistor string converter performs a stable digital-to-analog converting operation. This resistor string converter, however, requires a large area and, thus, is not suitable for a high level of integration.

The area of the conventional resistor string converter illustrated in FIG. 1 is increased $2^N$ times when the number of bits of input data is increased by N. For example, when the size of a decoder of a 6-bit system is 100, the size of a decoder of an 8-bit system becomes 400 (=$100 \times 2^2$) and the size of a decoder of a 10-bit system becomes 1600 (=$100 \times 2^4$). Accordingly, it is difficult to use the resistor string converter in systems processing more than 10 bits.

To solve this problem, digital-to-analog converters suitable for a high level of integration have been studied in various ways. One of the digital-to-analog converters suitable for a high level of integration is a digital-to-analog converter using the charging of a capacitor and a charge distribution.

FIG. 2 is a circuit diagram of a conventional capacitor converter using the charging of capacitors and a charge distribution. Referring to FIG. 2, the capacitor converter includes a digital data input unit 202 having data switches Sd1 and Sd2, a charging switch Sc1, a charging capacitor C1, a distribution switch Sc2, a distribution capacitor C2, and an initialization switch Sc3. The initialization switch Sc3 discharges the charging capacitor C1 and the distribution capacitor C2 to initialize them before a converting operation.

When the data switches Sd1 and Sd2 transfer the upper limit voltage Va or the lower limit voltage Vb in response to the logic level of the first bit of the digital data input to the data input unit 202, the charging switch Sc1 is closed and subsequently opened such that the charging capacitor C1 is charged with the upper limit voltage Va or the lower limit voltage Vb. Then the distribution switch Sc2 is closed and subsequently opened to distribute the charges stored in the charging capacitor C1 to the distribution capacitor C2. Subsequently, the charging capacitor C1 is charged with the upper limit voltage Va or the lower limit voltage Vb in response to the logic level of the second bit of the input digital data and the charges of the charging capacitor C1 are distributed to the distribution capacitor C2 such that charges are accumulatively stored in the distribution capacitor C2.

The aforementioned operation is repeated n times in the case of n-bit data to finally charge the distribution capacitor C2 with the voltage Vo corresponding to the input digital data.

The converting operation using the charging capacitor C1 and the distribution capacitor C2, however, requires a long period of time for generating a final voltage, because it has to perform n charging and distribution operations to convert n-bit data into an analog signal. Furthermore, the operation of the capacitor converter is not stable and, thus, the reliability of the capacitor converter is deteriorated even though the area of the capacitor converter is reduced.

SUMMARY OF THE INVENTION

Exemplary embodiments of the present invention provide a digital-to-analog converter that can be highly integrated due to its small area and that can rapidly perform a stable converting operation.

According to an exemplary embodiment of the present invention, there is provided a digital-to-analog converter comprising a data input unit, a first conversion unit, a second conversion unit, and a signal output unit. The data input unit comprises data switches that are opened and closed in response to a logic level of input digital data. The first conversion unit comprises a first charging capacitor charged with a voltage transferred through the data switches in response to a first charging control signal, and a first distribution capacitor charged with a voltage corresponding to the digital data through a charge distribution between the first charging capacitor and the first distribution capacitor in response to a first distribution control signal. The second conversion unit comprises a second charging capacitor charged with a voltage transferred through the data switches in response to a second charging control signal, and a second distribution capacitor charged with the voltage corresponding to the digital data through a charge distribution between the second charging capacitor and the second distribution capacitor in response to a second distribution control signal. The signal output unit is selectively connected to the first conversion unit or the second conversion unit in response to a select control signal and outputs an analog data signal corresponding to the voltage across the first distribution capacitor or the voltage across the second distribution capacitor.

The second conversion unit outputs the voltage across the second distribution capacitor charged with the voltage corresponding to the digital data to the signal output unit when the first conversion unit charges the first distribution capacitor with the voltage corresponding to the digital data, and the first conversion unit outputs the voltage across the first distribution capacitor charged with the voltage corresponding to the digital data to the signal output unit when the second conversion unit charges the second distribution capacitor with the voltage corresponding to the digital data.

The capacitance of the first charging capacitor can be equal to that of the first distribution capacitor, and the capacitance of the second charging capacitor can be equal to that of the second distribution capacitor.

The signal output unit may comprise an operational amplifier having a first input terminal receiving a reference level voltage for setting a reference level, a second input terminal connected to a first terminal of the first distribution capacitor or a first terminal of the second distribution capacitor in response to the select control signal, and an output terminal connected to a second terminal of the first distribution capacitor or a second terminal of the second distribution capacitor in response to the select control signal.

The operational amplifier may output a voltage corresponding to a sum of the reference level voltage and one of the voltage across the first distribution capacitor and the voltage across the second distribution capacitor.

According to an exemplary embodiment of the present invention, there is provided a digital-to-analog converter comprising a bit-dividing unit, an upper bit input unit, a lower bit input unit, a first conversion unit, a second conversion unit, and a signal output unit. The bit-dividing unit divides input n-bit data into m-bit upper bit data and (n–m)-bit lower bit data and stores the m-bit upper bit data and the (n–m)-bit lower bit data. The upper bit input unit selects an upper limit voltage and a lower limit voltage corresponding to the m-bit upper bit data among voltages belonging to the voltage range between a maximum voltage and a minimum voltage applied thereto. The lower bit input unit receives the (n–m)-bit lower bit data bit by bit and outputs the upper limit voltage or the lower limit voltage in response to the logic level of the received bit data. The first conversion unit comprises a first charging capacitor charged with a voltage corresponding to the upper limit voltage or the lower limit voltage in response to a first charging control signal and a first distribution capacitor charged with a voltage corresponding to the n-bit data through a charge distribution between the first charging capacitor and the first distribution capacitor in response to a first distribution control signal. The second conversion unit comprises a second charging capacitor charged with a voltage corresponding to the upper limit voltage or the lower limit voltage in response to a second charging control signal, and a second distribution capacitor charged with the voltage corresponding to the n-bit data through a charge distribution between the second charging capacitor and the second distribution capacitor in response to a second distribution control signal. The signal output unit is selectively connected to the first conversion unit or the second conversion unit in response to a select control signal, and outputs an analog data signal corresponding to the voltage across the first distribution capacitor or the voltage across the second distribution capacitor.

The number m of the upper bit data may be set as an initial value or varied by resetting.

The upper limit voltage may be a voltage on the assumption that all the bits of the lower bit data have a logic high level.

The lower limit voltage may be a voltage on the assumption that all the bits of the lower bit data have a logic low level.

The lower bit input unit sequentially receives a least significant bit (LSB), lower bits, upper bits and a most significant bit (MSB) of the lower bit data.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
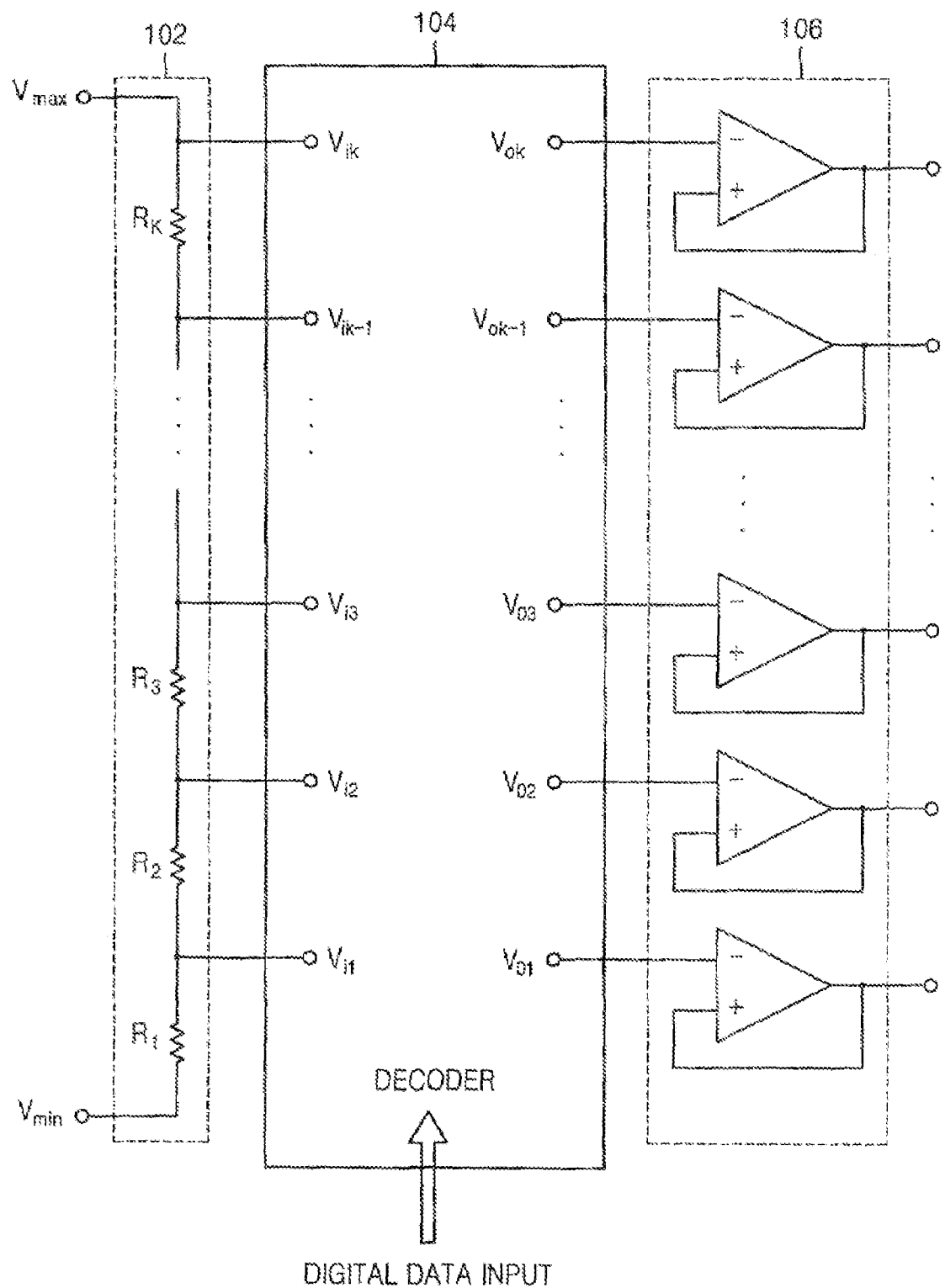
FIG. 1 is a block diagram of a conventional resistor string converter.
Figure 2:
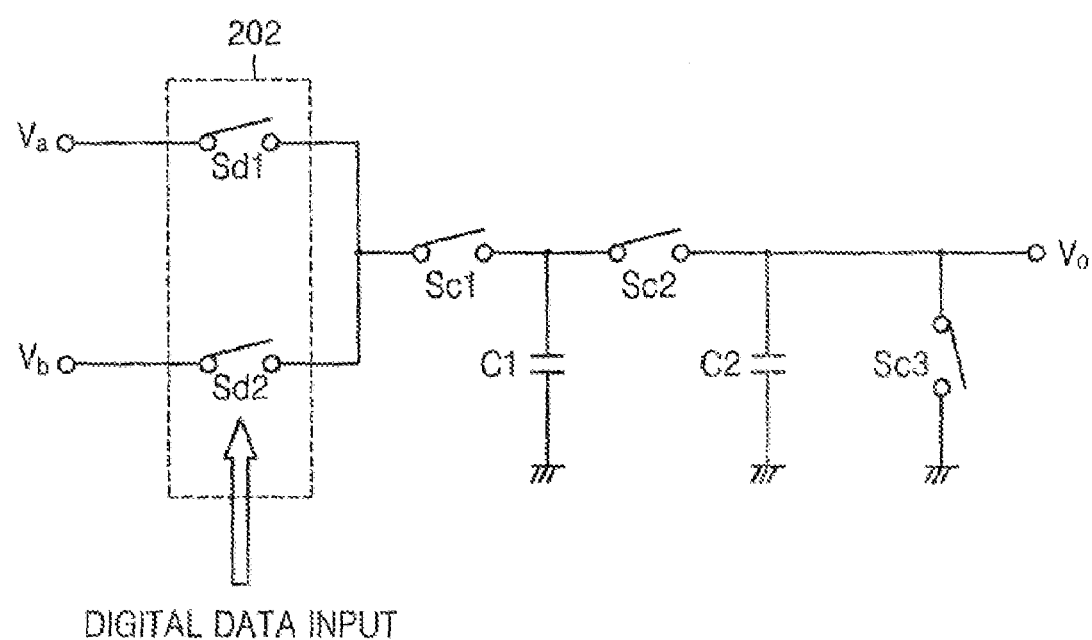
FIG. 2 is a circuit diagram of a conventional capacitor converter using charging of capacitors and charge distribution.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Throughout the drawings, like reference numerals refer to like elements.

Figure 3:
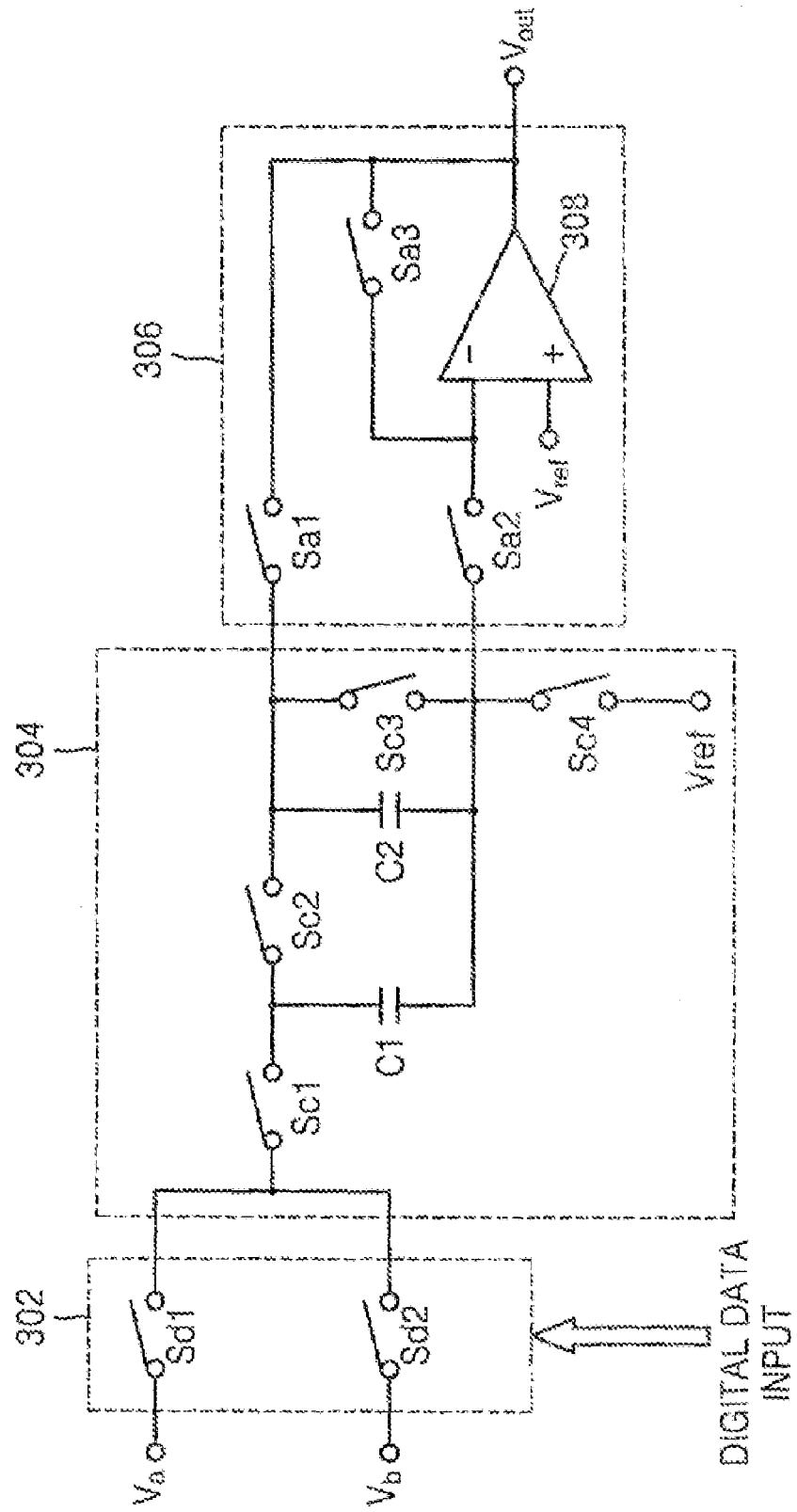
FIG. 3 is a block diagram of a capacitor converter using an operational amplifier.

FIG. 3 is a block diagram of a capacitor converter using an operational amplifier. Referring to FIG. 3, the capacitor converter includes a data input unit 302, a conversion unit 304, and a signal output unit 306. The data input unit 302 includes data switches Sd1 and Sd2. The conversion unit 304 includes a charging switch Sc1, a charging capacitor C1, a distribution switch Sc2, a distribution capacitor C2, an initialization switch Sc3, and a level switch Sc4. The signal output unit 306 includes an operational amplifier 308 and a plurality of switches Sa1, Sa2 and Sa3.

N-bit digital data is input bit by bit to the data input unit 302. When the logic level of the first bit of the input n-bit digital data is high, the data switch Sd1, the charging switch Sc1 and the level switch Sc4 are turned on and, thus, the charging capacitor C1 is charged with a voltage Va–Vref obtained by subtracting a reference level voltage Vref from an upper limit voltage Va. When the logic level of the first bit of the input n-bit digital data is low, the data switch Sd2, the charging switch Sc1 and the level switch Sc4 are turned on and, thus, the charging capacitor C1 is charged with a voltage Vb−Vref obtained by subtracting the reference level voltage Vref from a lower limit voltage Vb. When the distribution switch Sc2 is turned on to connect the charging capacitor C1 charged with the voltage Va−Vref or Vb−Vref to the distribution capacitor C2, charge distribution occurs between the charging capacitor C1 and the distribution capacitor C2.

The aforementioned operation is repeated to increase or decrease the quantity of charges accumulatively charged in the distribution capacitor C2 in response to the logic levels of the input data bits. When the operation is repeated n times, the distribution capacitor C2 is finally charged with a voltage corresponding to the n-bit digital data.

When the charging operation of the distribution capacitor C2 is completed, the switches Sa1 and Sa2 are turned on. Then the signal output unit 306 outputs the voltage corresponding to the sum of the reference voltage Vref and the voltage across the distribution capacitor C2 charged with the voltage corresponding to the n-bit digital data as an output voltage Vout using a virtual short circuit characteristic of the operational amplifier 308. The initialization switch Sc3 discharges the charging capacitor C1 and the distribution capacitor C2 to initialize them. The switch Sa3 is turned on when the capacitor converter is initialized such that the signal output unit 306 outputs the reference level voltage Vref.

In the aforementioned capacitor converter, however, the conversion unit 304 cannot perform the operation of charging the distribution capacitor C2 for the next input n-bit digital data while the signal output unit 306 outputs the voltage corresponding to the first input n-bit digital data, that is, the voltage corresponding to the sum of the reference level voltage Vref and the voltage across the distribution capacitor C2. That is, the charging operation of the conversion unit 304 has to pause until the operation of the signal output unit 306 has finished. The time required for the digital-to-analog converting operation of the capacitor converter is increased by the pause in the charging operation of the conversion unit 304.

Figure 4:
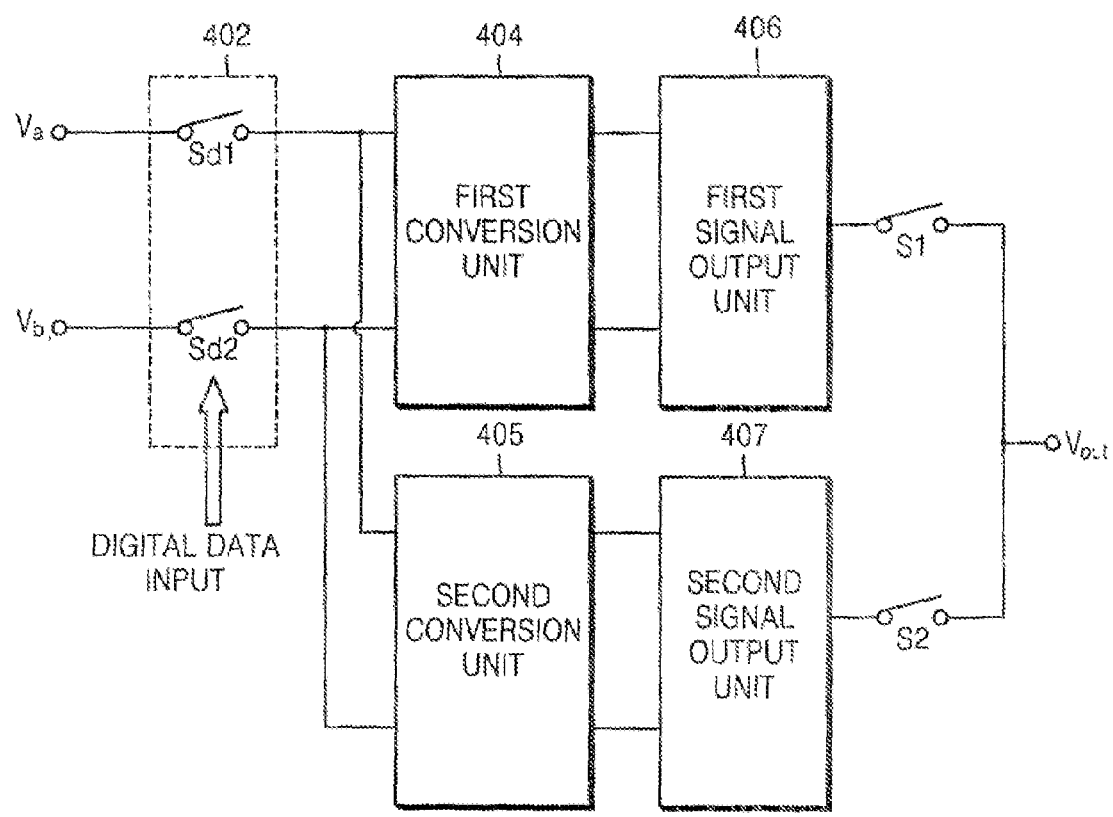
FIG. 4 is a block diagram of a digital-to-analog converter that makes up for the shortcoming of the capacitor converter illustrated in FIG. 3.

FIG. 4 is a block diagram of a digital-to-analog converter that makes up for the shortcoming of the capacitor converter illustrated in FIG. 3. Referring to FIG. 4, the digital-to-analog converter includes a data input unit 402, a first conversion unit 404, a second conversion unit 405, a first signal output unit 406, and a second signal output unit 407. The data input unit 402 corresponds to the data input unit 302 of FIG. 3. Each of the first and second conversion units 404 and 405 has the same configuration as that of the conversion unit 304 of FIG. 3 and each of the first and second signal output units 406 and 407 has the same configuration as that of the signal output unit 306 of FIG. 3.

When the first conversion unit 404 receives a voltage corresponding to the digital data from the data input unit 402 to charge a first distribution capacitor (corresponding to the distribution capacity C2 of FIG. 3), the second conversion unit 405 outputs the voltage across a second distribution capacitor (corresponding to the distribution capacitor C2 of FIG. 3) that has been charged with a voltage corresponding to previously input digital data to the second signal output unit 407. The output voltage Vout of the second signal 407 is output to an output terminal via a switch S2.

On the other hand, when the second conversion unit 405 receives the voltage corresponding to the digital data from the data input unit 402 to charge the second distribution capacitor, the first conversion unit 404 outputs the voltage across the first distribution capacitor that has been charged with the voltage corresponding to the previously input digital data to the first signal output unit 406. The output voltage Vout of the first signal output unit 406 is output to the output terminal via a switch S1.

In the digital-to-analog converter having the aforementioned configuration illustrated in FIG. 4, the second conversion unit 405 and the second signal output unit 407 perform the operation of outputting the voltage across the distribution capacitor charged with a voltage corresponding to previous digital data, while the first conversion unit 404 and the data input unit 402 carry out the operation of charging the distribution capacitor with a voltage corresponding to current digital data, and the first conversion unit 404 and the first signal output unit 406 perform the outputting operation while the second conversion unit 405 and the second signal output unit 407 execute the charging operation. Accordingly, the period of time required for the digital-to-analog converting operation can be reduced.

In the digital-to-analog converter of FIG. 4, the first signal output unit 406 does not perform any operation while the first conversion unit 404 and the data input unit 402 carry out the charging operation and the second conversion unit 405 and the second signal output unit 407 execute the outputting operation. Likewise, the second signal output unit 407 does not perform any operation while the second conversion unit 405 and the data input unit 402 carry out the charging operation and the first conversion unit 404 and the first signal output unit 406 execute the outputting operation. Accordingly, the area of the digital-to-analog converter can be further reduced by combining the first and second signal output units 406 and 407.

Figure 5:
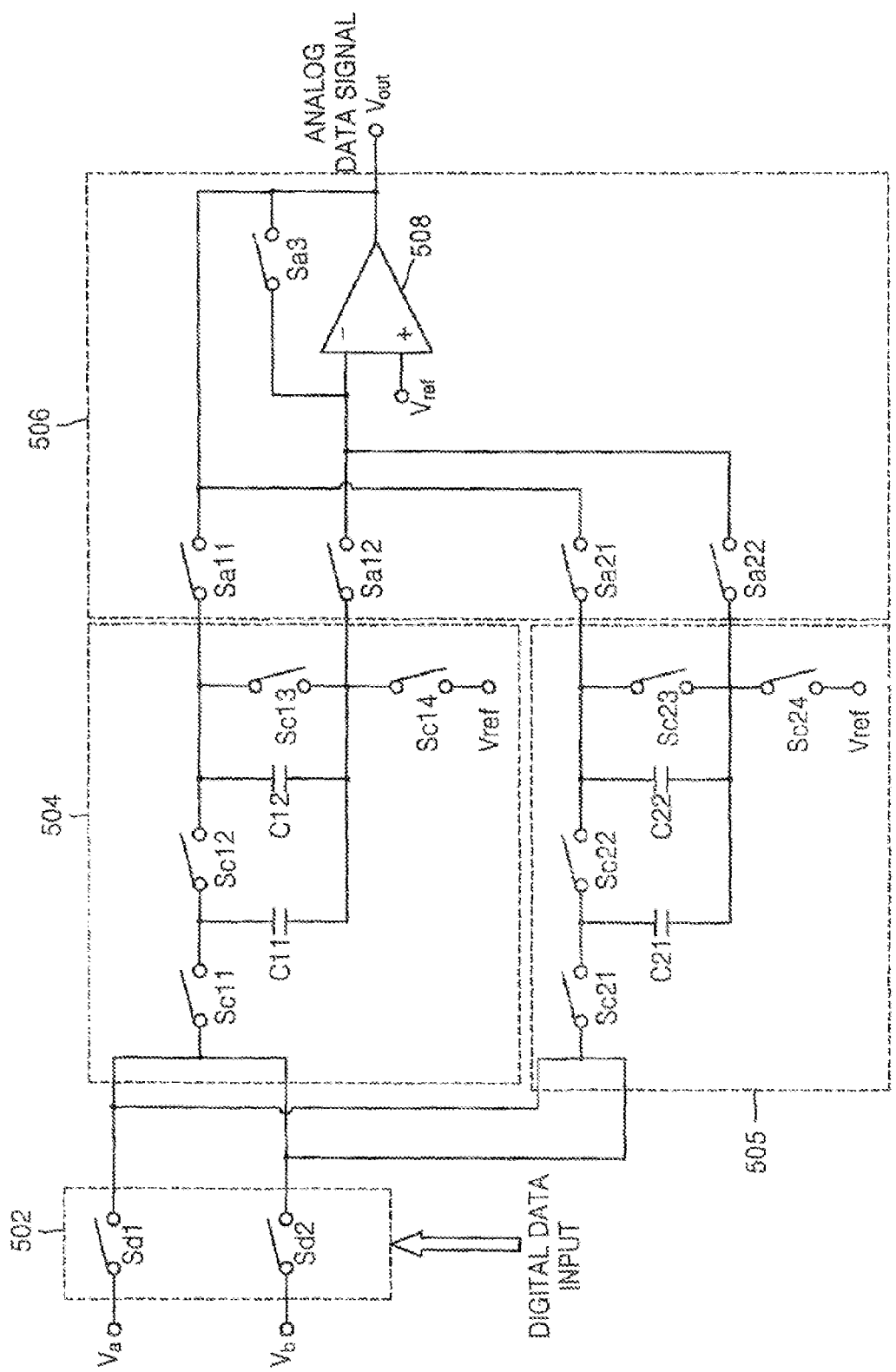
FIG. 5 is a block diagram of a digital-to-analog converter according to an exemplary embodiment of the present invention.

FIG. 5 is a block diagram of a digital-to-analog converter according to an exemplary embodiment of the present invention. Referring to FIG. 5, the digital-to-analog converter includes a data input unit 502, a first conversion unit 504, a second conversion unit 505, and a signal output unit 506. The data input unit 502 includes first and second data switches Sd1 and Sd2. The first conversion unit 504 includes a first charging switch Sc11, a first charging capacitor C11, a first distribution switch Sc12, a first distribution capacitor C12, a first initialization switch Sc13, and a first level switch Sc14. The second conversion unit 505 includes a second charging switch Sc21, a second charging capacitor C21, a second distribution switch Sc22, a second distribution capacitor C22, a second initialization switch Sc23, and a second level switch Sc24. The signal output unit 506 includes an operational amplifier 508, first select switches Sa11 and Sa12, second select switches Sa21 and Sa22, and a connection switch Sa3.

The first and second distribution capacitors C12 and C22 are charged with a voltage corresponding to the digital data input in a charging operation of the first and second conversion units 504 and 505. The first and second distribution capacitors C12 and C22 function as voltage holding capacitors for maintaining an output voltage Vout uniform in an outputting operation of the signal output unit 506.

The capacitance of the first charging capacitor C11 may be equal to the capacitance of the first distribution capacitor C12 and the capacitance of the second charging capacitor C21 may be equal to the capacitance of the second distribution capacitor C22.

The operational amplifier 508 of the signal output unit 506 includes a first input terminal (+) receiving a reference level voltage Vref for setting a reference level, a second input terminal (−) selectively connected to a first terminal of the first distribution capacitor C12 or a first terminal of the second distribution capacitor C22, and an output terminal selectively connected to a second terminal of the first distribution capacitor C12 or a second terminal of the second distribution capacitor C22.

The connection switch Sa3 connects the second input terminal and the output terminal of the operational amplifier 508 to output the reference level voltage Vref as an output signal of the output unit 506 when the digital-to-analog converter is initialized.

The operation of charging the first distribution capacitor C12 with a voltage corresponding to the digital data input by the data input unit 502 using the first conversion unit 504 will now be explained.

When 4-bit digital data "1011", for example, is input to the data input unit 502, the operation of charging the first distribution capacitor C12 is repeated four times because the digital data has 4 bits. The bits of the 4-bit digital data are sequentially input starting from the least significant bit (LSB). Assuming that the capacitance of the first charging capacitor C11 is equal to the capacitance of the first distribution capacitor C12, the capacitance of the second charging capacitor C21 is equal to the capacitance of the second distribution capacitor C22, an upper limit voltage is 10V, a lower limit voltage is 0V, and the reference level voltage Vref is 0V.

When the first initialization switch Sc13 is turned on, the first distribution capacitor C12 is discharged for initialization. The first charging capacitor C11 can be initialized by turning on the first initialization switch Sc13 and the first distribution switch Sc12. The second initialization switch Sc23 is used to initialize the second distribution capacitor C22.

The LSB of the 4-bit digital data, "1", is input first and, thus, the first data switch Sd1 is turned on. When the first charging switch Sc11 and the first level switch Sc14 are turned on, the first charging capacitor C11 is charged with a voltage (10V−0V=10V) obtained by subtracting the reference level voltage Vref from the upper limit voltage Va. When the first charging switch Sc11 is turned off and the first distribution switch Sc12 is turned on, charges are distributed between the first charging capacitor C11 and the first distribution capacitor C12 such that each of the first charging capacitor C11 and the first distribution capacitor C12 is charged with 5V (=[(Va+0V)/2]).

Then, the next data bit "1" is input to turn on the first data switch Sd1, the first charging switch Sc11 and the first level switch Sc14 and thus the first charging capacitor C11 is charged with the voltage (10V−0V=10V) obtained by subtracting the reference level voltage Vref from the upper limit voltage Va again. When the first charging switch Sc11 is turned off and the first distribution switch Sc12 is turned on, charges are distributed between the first charging capacitor C11 and the first distribution capacitor C12 such that each of the first charging capacitor C11 and the first distribution capacitor C12 is charged with 7.5V (=[(Va+Va/2)/2]).

Subsequently, the next data bit "0" is input to turn on the second data switch Sd2, the first charging switch Sc11 and the first level switch Sc14 and thus the first charging capacitor C11 is charged with a voltage (0V−0V=0V) obtained by subtracting the reference level voltage Vref from the lower limit voltage Vb. When the first charging switch Sc11 is turned off and the first distribution switch Sc12 is turned on, charges are distributed between the first charging capacitor C11 and the first distribution capacitor C12 such that each of the first charging capacitor C11 and the first distribution capacitor C12 is charged with 3.5V (=[(Vb+3Va/4)/2]).

The last data bit "1" is input to turn on the first data switch Sd1, the first charging switch Sc11 and the first level switch Sc14 and thus the first charging capacitor C11 is charged with the voltage (10V−0V=10V) obtained by subtracting the reference level voltage Vref from the upper limit voltage Va again. When the first charging switch Sc11 is turned off and the first distribution switch Sc12 is turned on, charges are distributed between the first charging capacitor C11 and the first distribution capacitor C12 such that each of the first charging capacitor C11 and the first distribution capacitor C12 is charged with 6.875V (=[(Va+{(Vb+3Va/4)/2}/2)]).

When the operation of charging the first distribution capacitor C12 is completed, the first select switches Sa11 and Sa12 are turned on such that the signal output unit 506 outputs the voltage Vout corresponding to the sum of the reference level voltage Vref and the voltage across the first distribution capacitor C12 to the output terminal using the virtual short circuit characteristic of the operational amplifier 508. Consequently, the 4-bit digital data "1011" is converted into the analog data signal Vout and is output.

While the first conversion unit 504 is outputting the voltage across the first distribution capacitor C12 to the signal output unit 506, the second conversion unit 505 sequentially receives the next 4-bit digital data from the data input unit 502 and charges the second distribution capacitor C22 with a voltage corresponding to the received 4-bit digital data.

When the operation of charging the second distribution capacitor C22 has finished, the second select switches Sa21 and Sa22 are turned on such that the signal output unit 506 outputs the voltage Vout corresponding to the sum of the reference level voltage Vref and the voltage across the second distribution capacitor C22 to the output terminal. While the second conversion unit 505 is outputting the voltage across the second distribution capacitor C22 to the signal output unit 506, the first conversion unit 504 sequentially receives the next 4-bit digital data from the data input unit 502 and charges the first distribution capacitor C12 with a voltage corresponding to the received 4-bit digital data.

The operation of the first and second conversion units 504 and 505 will now be explained with reference to FIGS. 6A and 6B.

Figure 6A:
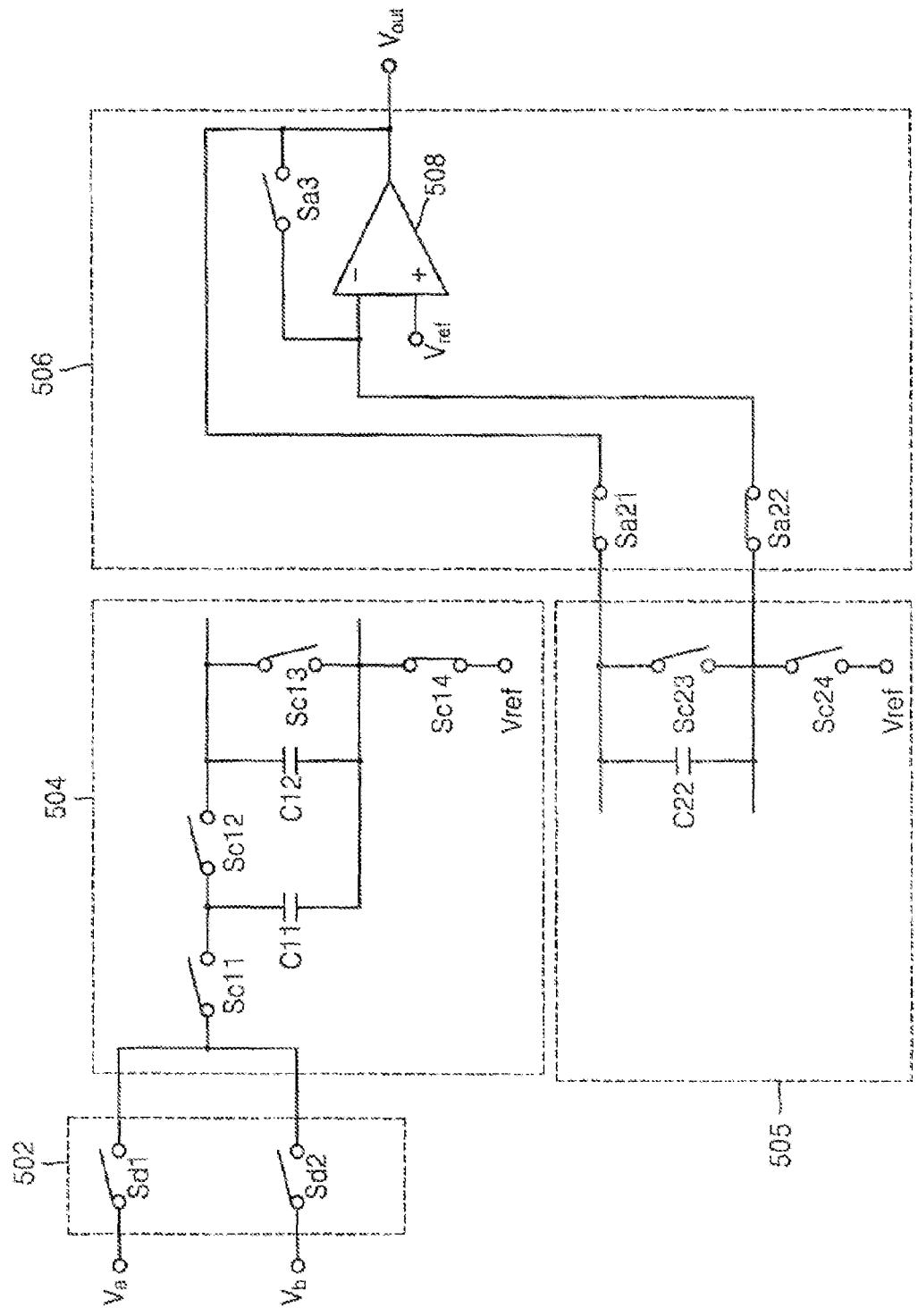
FIGS. 6A and 6B are block diagrams of the digital-to-analog converter of FIG. 5 for illustrating an operation of the digital-to-analog converter of FIG. 5.
Figure 6B:
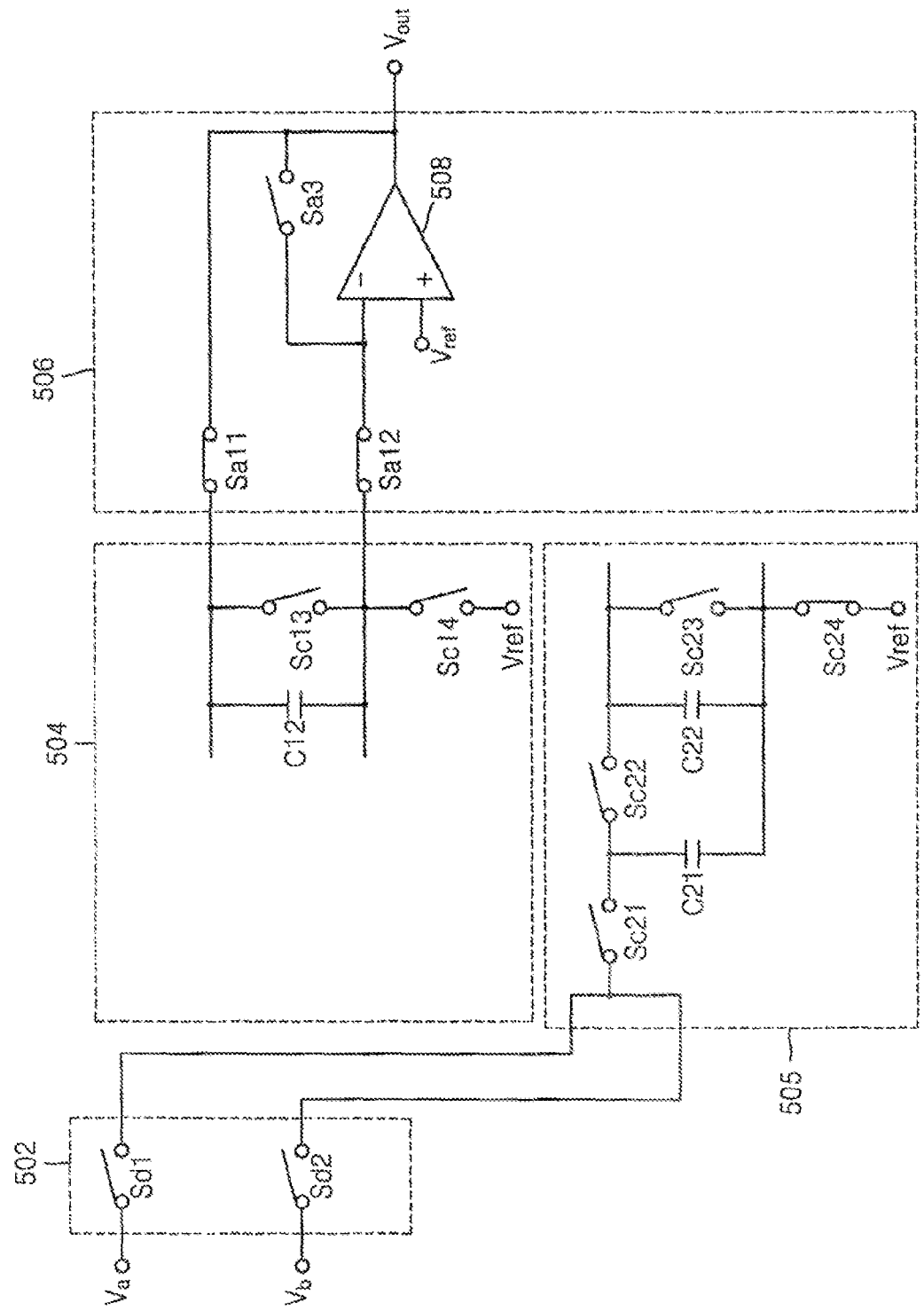

FIGS. 6A and 6B are block diagrams for illustrating an operation of the digital-to-analog converter of FIG. 5. Referring to FIG. 6A, the first conversion unit 504 charges the first distribution capacitor C12 with a voltage corresponding to current digital data and the second conversion unit 505 outputs the voltage across the second distribution capacitor C22 that has been already charged with a voltage corresponding to previously input digital data to the signal output unit 506.

Referring to FIG. 6B, the first conversion unit 504 outputs the voltage across the first distribution capacitor C12 that has been already charged with a voltage corresponding to previously input digital data to the signal output unit 506, and the second conversion unit 505 charges the second distribution capacitor C22 with a voltage corresponding to current digital data.

As described above, the second conversion unit 505 and the signal output unit 506 perform the outputting operation when the first conversion unit 504 and the data input unit 502 carry out the charging operation, then the first conversion unit 504 and the signal output unit 506 execute the outputting operation when the second conversion unit 505 and the data input unit 502 carry out the charging operation. This can reduce the length of time required for the digitalto-analog converting operation to increase the digital-to-analog converting speed of the digital-to-analog converter.

The first select switches Sa11 and Sa12 and the second select switches Sa21 and Sa22 are complementary-switched and, thus, any charge loss caused by the switching can be supplemented when the switches are composed of MOSFETs. For example, charges lost when the first select switches Sa11 and Sa12 are turned off can be used when the second select switches Sa21 and Sa22 are turned on, and charges lost when the second select switches Sa21 and Sa22 are turned off can be used when the first select switches Sa11 and Sa12 are turned on.

In the digital-to-analog converter according to the exemplary embodiment of the present invention, the voltage across the first distribution capacitor C12 or the voltage across the second distribution capacitor C22 is output without requiring a subsequent separate capacitor. Accordingly, the digital-to-analog converter according to the exemplary embodiment of the present invention can remarkably reduce charge transfer error generated when charges are transferred to the output unit compared to conventional converters having separate capacitors in their signal output units.

Furthermore, the digital-to-analog converter according to the exemplary embodiment of the present invention has a single signal output unit, distinguished from the digital-to-analog converter shown in FIG. 4 having two signal output units and, thus, the area of the digital-to-analog converter according to the exemplary embodiment of the present invention can be decreased.

Figure 7:
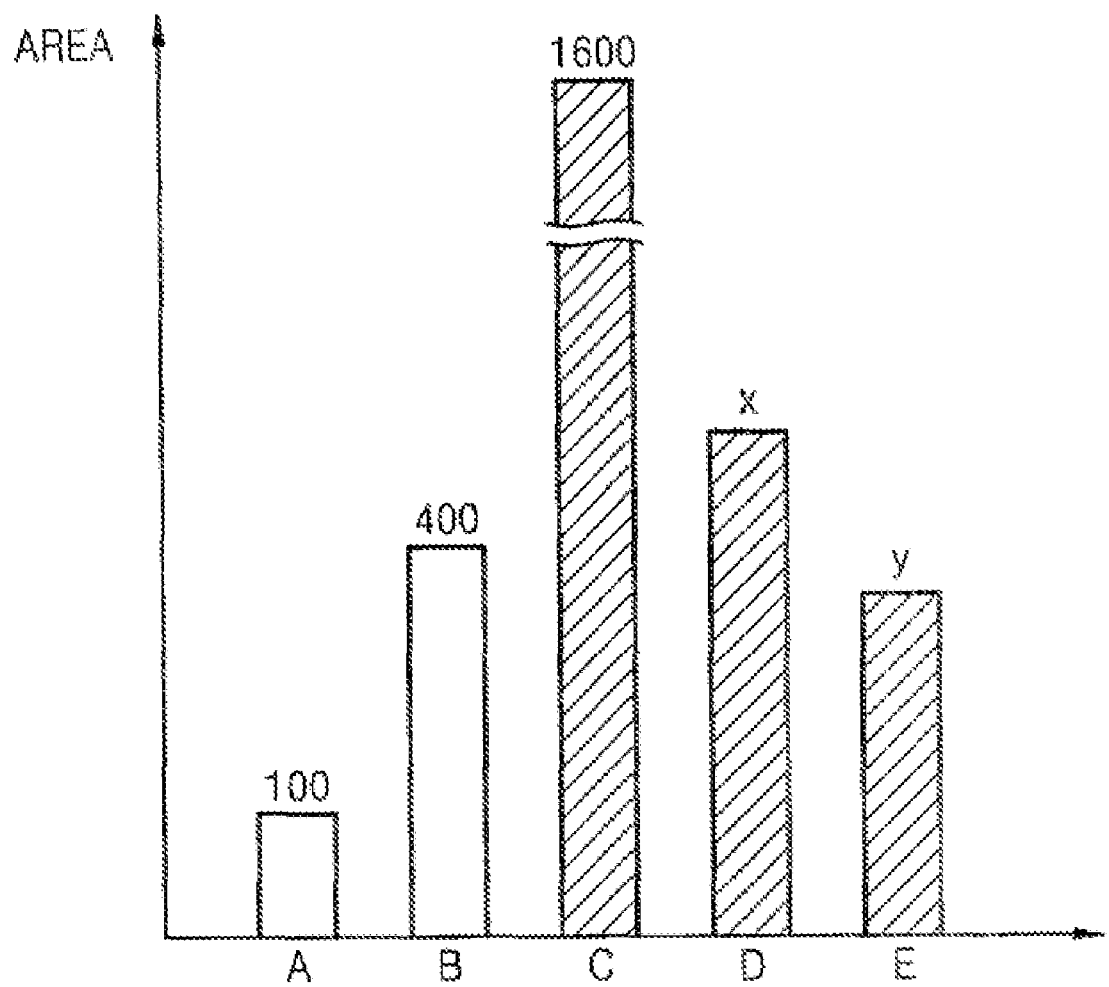
FIG. 7 is a bar chart showing areas required for the converters of FIGS. 1, 4 and 5.

FIG. 7 is a bar chart showing semiconductor chip areas required for of the converters of FIGS. 1, 4 and 5. If the area of the resistor string converter using a 6-bit decoder, illustrated in FIG. 1, is 100 (A), the resistor string converter requires 400 when using an 8-bit decoder (B) and 1600 when using a 10-bit decoder (C). The digital-to-analog converter according to the current embodiment of the present invention requires an area (E) corresponding to 20% to 30% of the area (C) and 60 to 70% of a case (D) in which the capacitor converter of FIG. 4 is used. It can be seen from FIG. 7 that the digital-to-analog converter according to the exemplary embodiment of the present invention is suitable for high integration.

Figure 8:
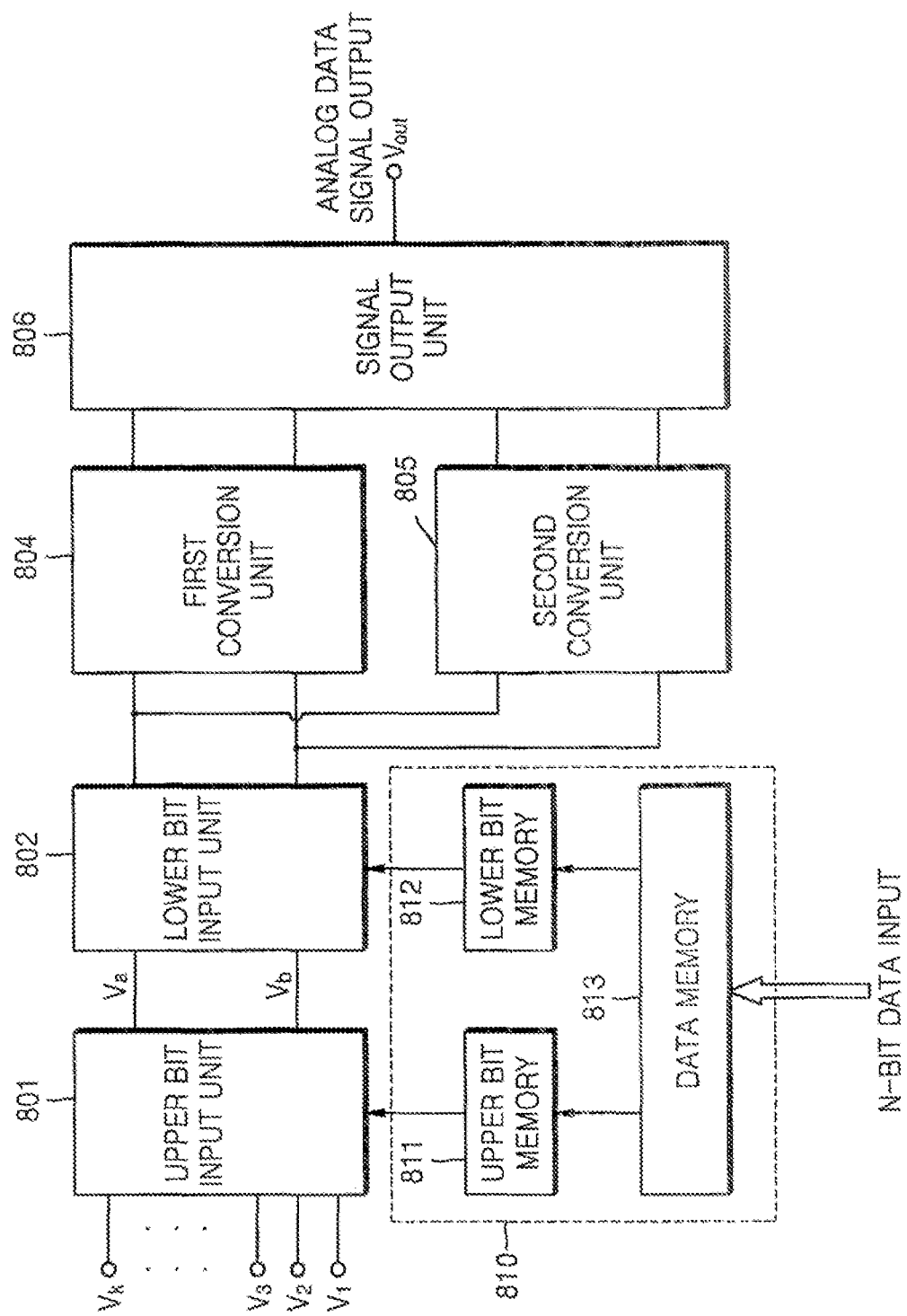
FIG. 8 is a block diagram of a digital-to-analog converter for improving the reliability of its digital-to-analog converting operation according to an exemplary embodiment of the present invention.

FIG. 8 is a block diagram of a digital-to-analog converter for improving the reliability of its digital-to-analog converting operation according to an exemplary embodiment of the present invention. Referring to FIG. 8, the digital-to-analog converter includes a bit-dividing unit 810 consisting of a data memory 813, an upper bit memory 811 and a lower bit memory 812, an upper bit input unit 801, a lower bit input unit 802, a first conversion unit 804, a second conversion unit 805, and a signal output unit 806. The first conversion unit 804, the second conversion unit 805 and the signal output unit 806 of FIG. 8 respectively correspond to the first conversion unit 504, the second conversion unit 505 and the signal output unit 506 of the system shown in FIG. 5.

The digital-to-analog converter of FIG. 8 includes the upper bit input unit 801 and the lower bit input unit 802 in order to improve the stability and reliability of the converting operation thereof.

The n-bit data input to the data memory 813 is divided into m-bit upper bit data and (n–m)-bit lower bit data. The m-bit upper bit data is stored in the upper bit memory 811 and then input to the upper bit input unit 801. The (n–m)-bit lower bit data is stored in the lower bit memory 812 and then input to the lower bit input unit 802. That is, the bit-dividing unit 810 divides the input n-bit data into the m-bit upper bit data and the (n–m)-bit lower bit data and respectively stores them.

The upper bit input unit 801 receives voltages V1, V2, V3, . . . , Vk ranging between a maximum voltage Vk and a minimum voltage V1 and receives the upper bit data from the upper bit memory 811. The upper bit input unit 801 selects an upper limit voltage and a lower limit voltage corresponding to the upper bit data from among the voltages V1, V2, V3, . . . , Vk and outputs the upper limit voltage Va and the lower limit voltage Vb to the lower bit input unit 802. The upper limit voltage Va output to the lower bit input unit 802 is a voltage based on the assumption that all the bits of the lower bit data have a logic high level. The lower limit voltage Vb is a voltage based on the assumption that all the bits of the lower bit data have a logic low level.

In the n-bit data, the most significant bit (MSB) is the most important information, other upper bits are less significant than the MSB, lower bits are less significant than the upper bits, and the LSB has the lowest significance. Thus, the upper bit data having a high significance in the n-bit data is separately extracted and the upper limit voltage Va and the lower limit voltage Vb of a voltage range that can be output by the lower bit input unit 802 are previously set on the basis of the extracted upper bit data.

While converting errors relevant to the upper bit data largely affect the final converting result for all of the n-bit data, the influence of converting errors relevant to the lower bit data on the final converting result for all of the n-bit data is relatively insignificant. The capacitor converter has low operation stability and reliability, although it is suitable for high level integration due to its small area, as described above. In consideration of these two aspects, an exemplary embodiment of the present invention improves the stability of the converting operation for the upper bit data by avoiding using the capacitor converter and increases the level of integration of the converter by using the capacitor converter for the converting operation for the lower bit data. In FIG. 8, the lower bit input unit 802 and the first conversion unit 804 or the lower bit input unit 802 and the second conversion unit 805 are operated as a capacitor converter.

Since the upper limits voltage Va and the lower limit voltage Vb of the voltage range that can be output by the lower bit input unit 802 are already set based on the upper bit data, the overall converting error is not increased even when converting errors with respect to the lower bit data are generated.

The value m can be set as an initial value or can be varied by resetting. The integration of the converter increases as m become smaller, and the operation stability of the converter increases as m becomes larger.

The lower bit input unit 802 receives the lower bit data bit by bit from the lower bit memory 812, outputs the upper limit voltage Va when the logic level of the received lower bit data is high and outputs the lower limit voltage Vb when the logic level of the received lower bit data is low. The lower bit input unit 802 is similar to the data input unit 502 of FIG. 5. The bits of the lower bit data are sequentially input to the lower bit input unit 802 starting from the LSB.

The first conversion unit 804, the second conversion unit 805 and the signal output unit 806 respectively correspond to the first conversion unit 504, the second conversion unit 505 and the signal output unit 506 of FIG. 5.

Figure 9:
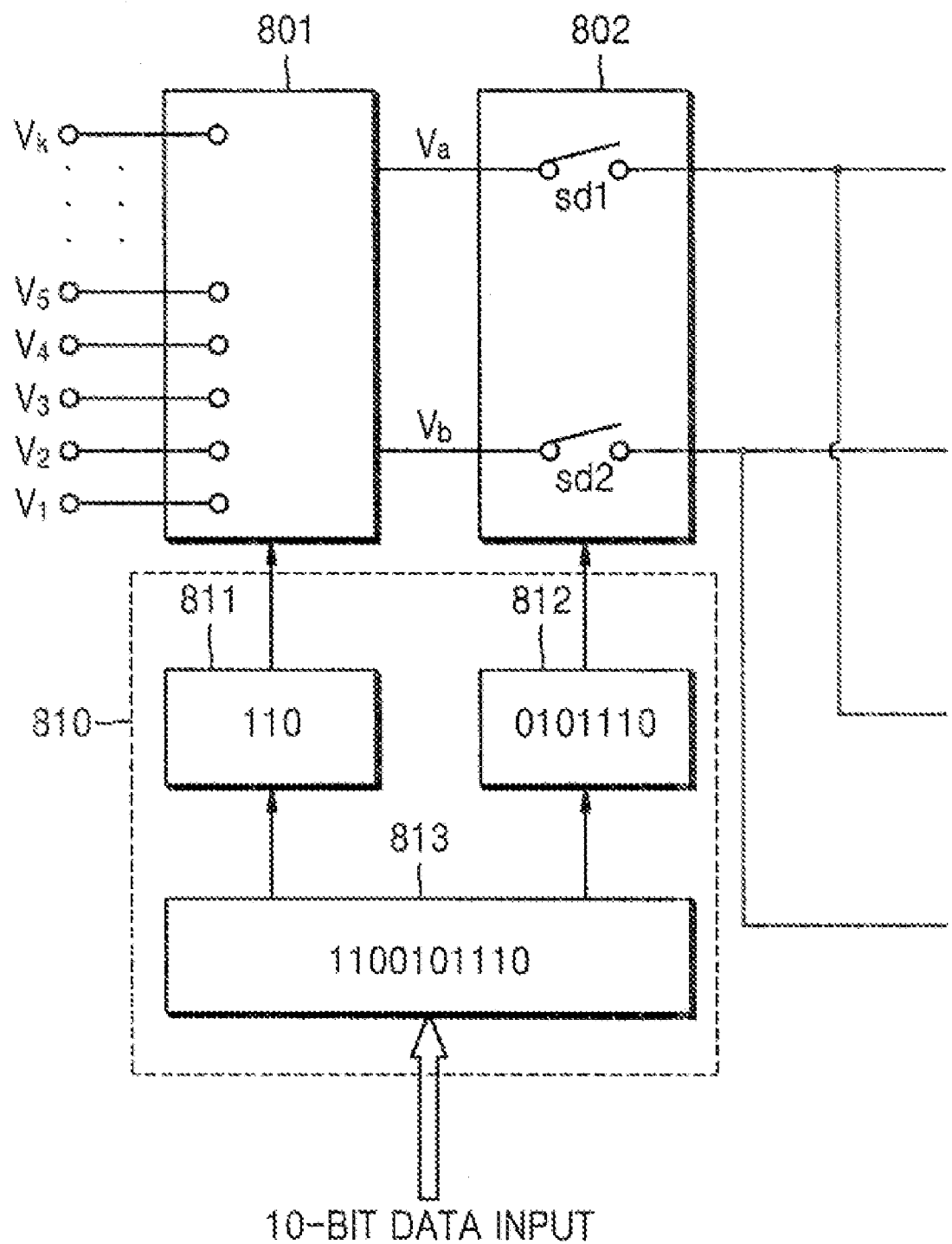
FIG. 9 is a block diagram of a section of the digital-to-analog converter of FIG. 8 for illustrating a converting operation wherein 10-bit data is input to the digital-to-analog converter of FIG. 8.

FIG. 9 is a block diagram of a section of the digital-to-analog converter of FIG. 8 for illustrating a converting operation when 10-bit data is input to the digital-to-analog converter of FIG. 8. In FIG. 9, m is set to 3.

When 10-bit data "1100101110" is input to the data memory 813, the 10-bit data is divided into upper bit data "110" and lower bit data "0101110" and respectively stored in the upper bit memory 811 and the lower bit memory 812. The upper bit input unit 801 selects a voltage range corresponding to the upper bit data "110" from the voltages V1, V2, V3, . . . , Vk applied thereto and outputs the upper limit voltage Va and the lower limit voltage Vb of the selected voltage range to the lower bit input unit 802.

The lower bit input unit 802 receives the lower bit data "0101110" bit by bit from the lower bit memory 812 and turns on the first data switch Sd1 to output the upper limit voltage Va when the logic level of the received bit data is high. The lower bit input unit 802 turns on the second data switch Sd2 to output the lower limit voltage Vb when the logic level of the received bit data is low.

The capacitor converting operation of the first or second conversion unit 804 or 805 and the signal outputting operation of the signal output unit 806 have been explained above and thus descriptions thereof are omitted.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A digital-to-analog converter comprising:
    a data input unit including data switches that are opened and closed in response to a logic level of input digital data;
    a first conversion unit including a first charging capacitor charged with a voltage transferred through the data switches in response to a first charging control signal, and a first distribution capacitor charged with a voltage corresponding to the digital data through a charge distribution between the first charging capacitor and the first distribution capacitor in response to a first distribution control signal;
    a second conversion unit including a second charging capacitor charged with a voltage transferred through the data switches in response to a second charging control signal, and a second distribution capacitor charged with the voltage corresponding to the digital data through a charge distribution between the second charging capacitor and the second distribution capacitor in response to a second distribution control signal; and
    a signal output unit selectively connected to the first conversion unit or the second conversion unit in response to a select control signal, and outputting an analog data signal corresponding to the voltage across the first distribution capacitor or the voltage across the second distribution capacitor.

2. The digital-to-analog converter of claim 1, wherein the second conversion unit is connected to the signal output unit when the first conversion unit receives the voltage transferred through the data switches, and the first conversion unit is connected to the signal output unit when the second conversion unit receives the voltage transferred through the data switches.

3. The digital-to-analog converter of claim 2, wherein the second conversion unit outputs the voltage across the second distribution capacitor charged with the voltage corresponding to the digital data to the signal output unit when the first conversion unit charges the first distribution capacitor with the voltage corresponding to the digital data, and the first conversion unit outputs the voltage across the first distribution capacitor charged with the voltage corresponding to the digital data to the signal output unit when the second conversion unit charges the second distribution capacitor with the voltage corresponding to the digital data.

4. The digital-to-analog converter of claim 1, wherein a capacitance of the first charging capacitor is equal to a capacitance of the first distribution capacitor.

5. The digital-to-analog converter of claim 1, wherein a capacitance of the second charging capacitor is equal to a capacitance of the second distribution capacitor.

6. The digital-to-analog converter of claim 1, wherein the data input unit comprises:
    a first data switch transferring an upper limit voltage that a voltage across the first distribution capacitor and a voltage across the second distribution capacitor can have in response to the logic level of the input digital data; and
    a second data switch transferring a lower limit voltage that a voltage across the first distribution capacitor and a voltage across the second distribution capacitor can have in response to the logic level of the input digital data.

7. The digital-to-analog converter of claim 1, wherein, for charging the first charging capacitor, the first conversion unit comprises:
    a first charging switch transferring the voltage transferred through the data switches to a first terminal of the first charging capacitor in response to the first charging control signal, and a first level switch transferring a reference level voltage for setting a reference level to a second terminal of the first charging capacitor in response to the first charging control signal.

8. The digital-to-analog converter of claim 7, wherein, for charging the second charging capacitor, the second conversion unit comprises:
    a second charging switch transferring the voltage transferred through the data switches to a first terminal of the second capacitor in response to the second charging control signal, and a second level switch transferring the reference level voltage to a second terminal of the second charging capacitor in response to the second charging control signal.

9. The digital-to-analog converter of claim 1, wherein, for charging the first distribution capacitor, the first conversion unit comprises a first distribution switch connecting the first charging capacitor to the first distribution capacitor in response to the first distribution control signal.

10. The digital-to-analog converter of claim 9, wherein, for charging the second distribution capacitor, the second conversion unit comprises a second distribution switch connecting the second charging capacitor to the second distribution capacitor in response to the second distribution control signal.

11. The digital-to-analog converter of claim 1, wherein, for initializing the first distribution capacitor, the first conversion unit comprises a first initialization switch discharging the first distribution capacitor.

12. The digital-to-analog converter of claim 11, wherein, for to initializing the second distribution capacitor, the second conversion unit comprises a second initialization switch discharging the second distribution capacitor.

13. The digital-to-analog converter of claim 1, wherein the signal output unit comprises an operational amplifier having a first input terminal receiving a reference level voltage for setting a reference level, a second input terminal selectively connected to a first terminal of the first distribution capacitor or a first terminal of the second distribution capacitor in response to the select control signal, and an output terminal selectively connected to a second terminal of the first distribution capacitor or a second terminal of the second distribution capacitor in response to the select control signal.

14. The digital-to-analog converter of claim 13, wherein the operational amplifier outputs a voltage corresponding to a sum of the reference level voltage and one of the voltage across the first distribution capacitor and the voltage across the second distribution capacitor.

15. The digital-to-analog converter of claim 13, wherein, for selectively connecting between the signal output unit and the first conversion unit, the signal output unit comprises first select switches connecting the first terminal of the first distribution capacitor and the second terminal of the first distribution capacitor to the second input terminal and the output terminal of the operational amplifier, respectively.

16. The digital-to-analog converter of claim 15, wherein, for selectively connecting between the signal output unit and the second conversion unit, the signal output unit further comprises second select switches connecting the first terminal of the second distribution capacitor and the second terminal of the second distribution capacitor to the second input terminal and the output terminal of the operational amplifier, respectively.

17. The digital-to-analog converter of claim 13, wherein the signal output unit further comprises a connection switch that connects or disconnects the second input terminal and the output terminal of the operational amplifier in order to output the reference level voltage as an output signal of the signal output unit when the digital-to-analog converter is initialized.

18. A digital-to-analog converter comprising:
a bit-dividing unit dividing input n-bit data into m-bit upper bit data and (n−m)-bit lower bit data and storing the m-bit upper bit data and the (n−m)-bit lower bit data;
an upper bit input unit selecting an upper limit voltage and a lower limit voltage corresponding to the m-bit upper bit data from among voltages belonging to a voltage range between a maximum voltage and a minimum voltage applied thereto;
a lower bit input unit receiving the (n−m)-bit lower bit data bit by bit and outputting the upper limit voltage or the lower limit voltage in response to the logic level of the received bit data;
a first conversion unit including a first charging capacitor charged with a voltage corresponding to the upper limit voltage or the lower limit voltage in response to a first charging control signal, and a first distribution capacitor charged with a voltage corresponding to the n-bit data through a charge distribution between the first charging capacitor and the first distribution capacitor in response to a first distribution control signal;
a second conversion unit including a second charging capacitor charged with a voltage corresponding to the upper limit voltage or the lower limit voltage in response to a second charging control signal, and a second distribution capacitor charged with the voltage corresponding to the n-bit data through a charge distribution between the second charging capacitor and the second distribution capacitor in response to a second distribution control signal; and
a signal output unit selectively connected to the first conversion unit or the second conversion unit in response to a select control signal, and outputting an analog data signal corresponding to the voltage across the first distribution capacitor or the voltage across the second distribution capacitor.

19. The digital-to-analog converter of claim 18, wherein m can be set as an initial value and varied by resetting.

20. The digital-to-analog converter of claim 18, wherein the upper limit voltage is a voltage based on an assumption that all the bits of the lower bit data have a logic high level.

21. The digital-to-analog converter of claim 18, wherein the lower limit voltage is a voltage based on an assumption that all the bits of the lower bit data have a logic low level.

22. The digital-to-analog converter of claim 18, wherein the lower bit input unit sequentially receives a least significant bit (LSB), lower bits and a least lower bit of the lower bit data bit by bit.

23. The digital-to-analog converter of claim 18, wherein the second conversion unit outputs the voltage across the second distribution capacitor charged with the voltage corresponding to the n-bit data to the signal output unit when the first conversion unit receives the upper limit voltage or the lower limit voltage from the lower bit input unit and charges the first distribution capacitor with the voltage corresponding to the n-bit data, and the first conversion unit outputs the voltage across the first distribution capacitor charged with the voltage corresponding to the n-bit data to the signal output unit when the second conversion unit receives the upper limit voltage or the lower limit voltage from the lower bit input unit and charges the second distribution capacitor with the voltage corresponding to the n-bit data.

24. The digital-to-analog converter of claim 18, wherein a capacitance of the first charging capacitor is equal to a capacitance of the first distribution capacitor and a capacitance of the second charging capacitor is equal to a capacitance of the second distribution capacitor.

25. The digital-to-analog converter of claim 18, wherein the lower bit input unit comprises:
a first data switch transferring the upper limit voltage in response to the logic level of the lower bit data; and
a second data switch transferring the lower limit voltage in response to the logic level of the lower bit data.

26. The digital-to-analog converter of claim 18, wherein the first conversion unit comprises:
a first charging switch transferring the upper limit voltage or the lower limit voltage to a first terminal of the first charging capacitor in response to the first charging control signal.
a first level switch transferring a reference level voltage for setting a reference level to a second terminal of the first charging capacitor in response to the first charging control signal;
a first distribution switch connecting the first charging capacitor to the first distribution capacitor in response to the first distribution control signal; and
a first initialization switch discharging the first distribution capacitor to initialize the first distribution capacitor.

27. The digital-to-analog converter of claim 26, wherein the second conversion unit comprises:
a second charging switch transferring the upper limit voltage or the lower limit voltage to a first terminal of the second charging capacitor in response to the second charging control signal;
a second level switch transferring the reference level voltage to a second terminal of the second charging capacitor in response to the second charging control signal;

a second distribution switch connecting the second charging capacitor to the second distribution capacitor in response to the second distribution control signal; and a second initialization switch discharging the second distribution capacitor to initialize the second distribution capacitor.

28. The digital-to-analog converter of claim 18, wherein the signal output unit comprises an operational amplifier having a first input terminal receiving a reference level voltage for setting a reference level, a second input terminal selectively connected to a first terminal of the first distribution capacitor or a first terminal of the second distribution capacitor in response to the select control signal, and an output terminal selectively connected to a second terminal of the first distribution capacitor or a second terminal of the second distribution capacitor in response to the select control signal.

29. The digital-to-analog converter of claim 28, wherein the operational amplifier outputs a voltage corresponding to a sum of the reference level voltage and one of the voltage across the first distribution capacitor and the voltage across the second distribution capacitor.

30. The digital-to-analog converter of claim 28, wherein, for selectively connecting by the select control signal, the signal output unit comprises:

first select switches connecting the first terminal of the first distribution capacitor and the second terminal of the first distribution capacitor to the second input terminal and the output terminal of the operational amplifier, respectively; and second select switches connecting the first terminal of the second distribution capacitor and the second terminal of the second distribution capacitor to the second input terminal and the output terminal of the operational amplifier, respectively.

31. The digital-to-analog converter of claim 28, wherein the signal output unit further comprises a connection switch that connects or disconnects the second input terminal and the output terminal of the operational amplifier in order to output the reference level voltage as an output signal of the signal output unit when the digital-to-analog converter is initialized.

* * * * *